United States Patent [19]

Buckingham

[11] Patent Number: 4,706,161
[45] Date of Patent: Nov. 10, 1987

[54] DEVICE PROTECTIVE APPARATUS

[75] Inventor: John S. Buckingham, Roanoke, Tex.

[73] Assignee: Minnesota Mining and Manufacturing Company, St. Paul, Minn.

[21] Appl. No.: 931,675

[22] Filed: Nov. 17, 1986

[51] Int. Cl.[4] .................. B65D 73/02; H01H 47/00
[52] U.S. Cl. ................................ 361/220; 174/51; 206/331
[58] Field of Search ............... 206/328, 331; 361/220; 174/51, 52 R

[56] References Cited

U.S. PATENT DOCUMENTS

| | | | |
|---|---|---|---|
| 3,454,921 | 7/1969 | Coleman et al. | 206/331 X |
| 3,746,157 | 7/1973 | l'Anson | 206/331 |
| 4,026,412 | 5/1977 | Henson | 206/331 |
| 4,218,578 | 8/1980 | Olschewski et al. | 174/51 X |
| 4,585,121 | 4/1986 | Capelle | 206/331 |
| 4,615,441 | 10/1986 | Nakamura | 206/331 X |

Primary Examiner—Donald A. Griffin
Attorney, Agent, or Firm—Donald M. Sell; James A. Smith; John C. Barnes

[57] ABSTRACT

A protective apparatus for electrical devices having coplanar leads providing both mechanical and electrostatic discharge protection.

47 Claims, 8 Drawing Figures

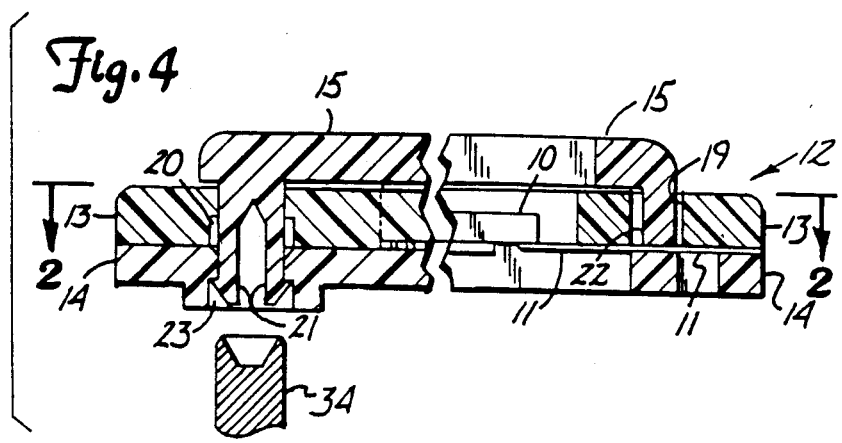
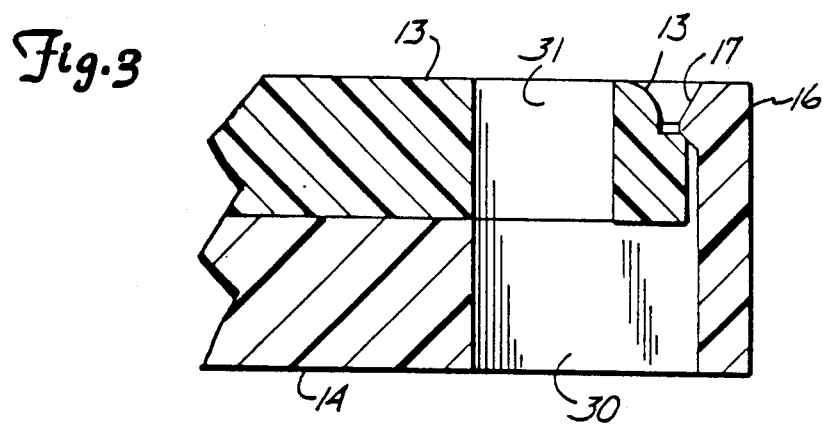
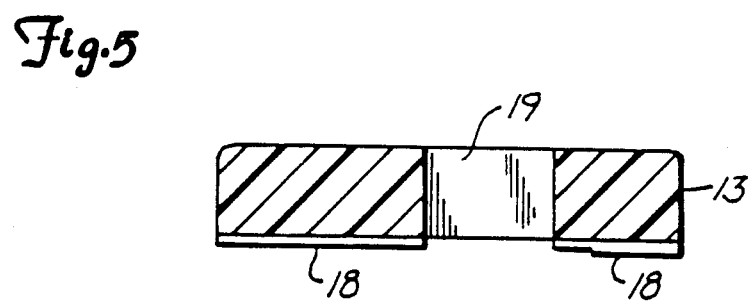

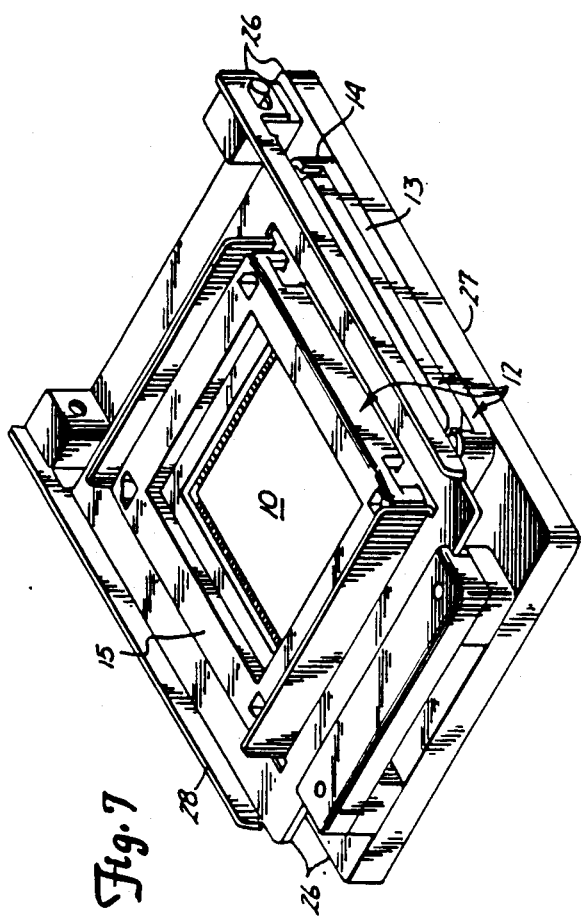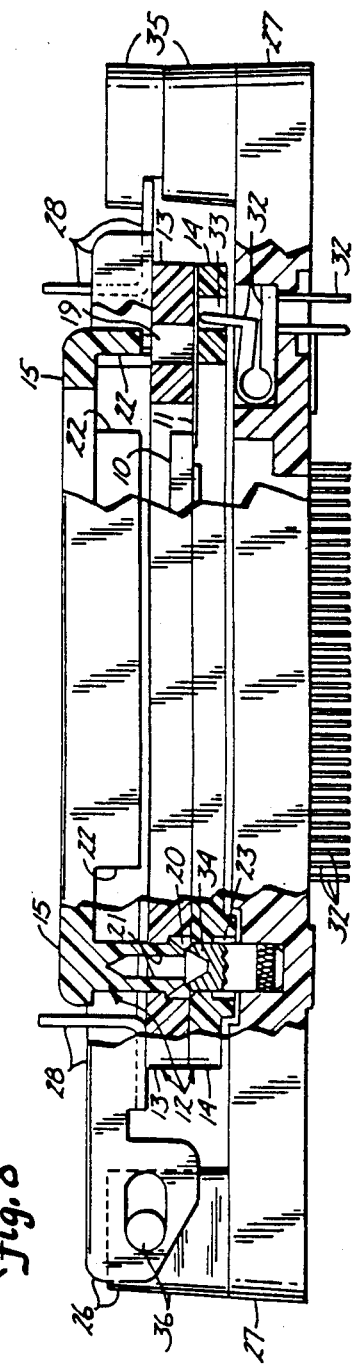

4,706,161

DEVICE PROTECTIVE APPARATUS

BACKGROUND OF THE INVENTION

1. Field of the Invention.

The present invention relates to protective enclosing apparatus for electrical devices, and more particularly, to apparatus which provide protection against mechanical impacts and static electricity discharges for electronic devices having coplanar terminal leads.

Competitive costs, the need for increasing the numbers functions performed by electronic circuits in smaller spaces, and the need for increasing the rapidity of circuit operations are among the primary factors which lead to continual demand for monolithic integrated circuit chips to have increases in the numbers of electronic components contained therein as fast as technology advances permit. Since the size of the semiconductor chips in which monolithic integrated circuits are formed has been increasing only modestly for quite some time, component densities on the chip must increase significantly to meet this demand. Such density increases mean that smaller and smaller structural portions or features are required in forming each electronic device and the interconnections in such monolithic integrated circuit chips to thereby permit the necessary component density increases. A result of the use of such smaller structural portions is that these portions are more susceptible to irreversible changes because of static electricity discharges.

A further corollary of the factors forcing monolithic integrated circuit chips to have greater component densities therein is that the housings for such chips and terminal leads therefrom must be kept as small in size as possible to realize the value of increasing density of components in the chips. This permits as many such chips as possible to be assembled into systems taking up no more, and hopefully less, physical volume. Thus, the housing structures themselves are becoming more delicate as the various structural aspects of them are reduced in size.

Yet, despite the use of more delicate structural portions, the requirement for these dense monolithic integrated circuit chips placed in such reduced size housings continues that they still be able to withstand various environmental rigors. To insure this, such housed chips must be tested in environments simulating those in which they are to be used.

There is, as a result, the need for external protective arrangements to permit handling of such monolithic integrated circuit chips as contained in the more delicate housings being provided therefor. Further, such external handling apparatus must provide for eliminating the risks of static electricity accumulations thereon, or on such housings, if the structures in the chips are to be prevented from suffering discharge damage. Further, this apparatus must be capable of permitting tests of such monolithic integrated circuit chips, including tests at elevated temperatures or in other difficult environments.

SUMMARY OF THE INVENTION

The present invention provides a protective apparatus for electrical devices having coplanar terminal leads extending outward therefrom comprising a base member and a holding member capable of holding such device leads therebetween so that a shorting member in the base member can be selectively positioned against such leads or removed therefrom. Such a base member and holding member with a shorting member can be relatively positioned in an electrical access socket to permit testing of the device.

BRIEF DESCRIPTION OF THE DRAWINGS

FIG. 3 is a cross section view of a portion of the present invention,

FIG. 4 is a cross section view of a portion of the present invention,

FIG. 5 is a cross section view of a portion of the present invention,

FIG. 7 is a complete assemblage of that which is shown in FIG. 1, and

FIG. 8 is a break-away view of certain portions of FIG. 7.

DETAILED DESCRIPTION OF THE PREFERRED EMBODIMENTS

Figure 1:
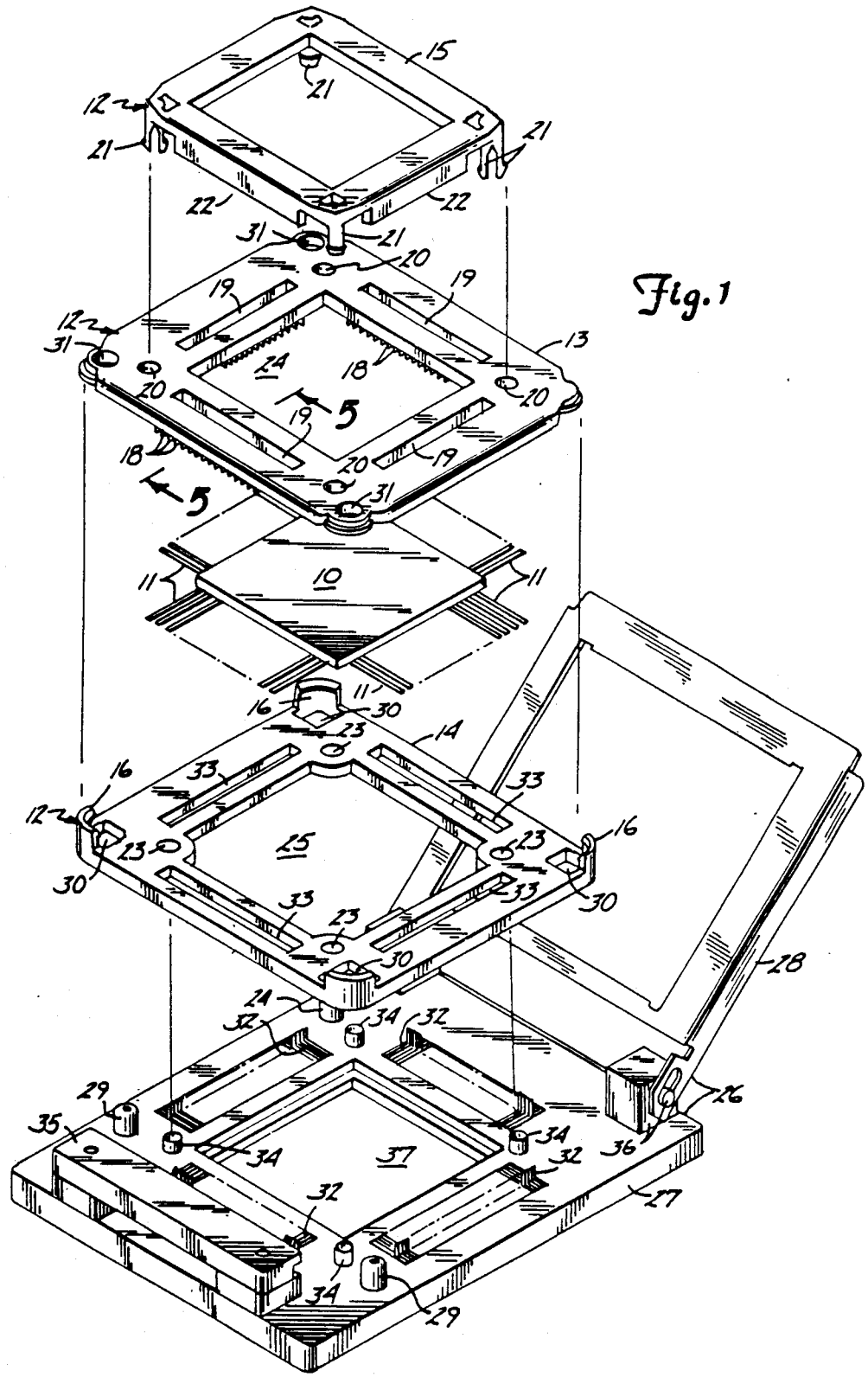
FIG. 1 is an exploded view showing the present invention.

FIG. 1 shows an exploded view of a socket and a carrier for mechanically and electrically protecting an electrical device, 10, having coplanar electrical terminal leads, 11, extending outward therefrom. Device 10 would typically comprise a monolithic integrated circuit chip mounted on a ceramic substrate. There would be electrical interconnections between the terminals on the monolithic integrated circuit chip and coplanar terminal leads 11 extending outward from the ceramic substrate. However, multiple circuit components could be provided on the substrate or, alternatively, any electrical device or electronic device arrangement with such coplanar leads could be protected through use of the present invention.

The carrier portion of FIG. 1 is designated 12 in that Figure, and is comprised of three members, as shown in FIG. 1. A base member, 13, in providing protection to electrical device 10, is held against a holding member, 14. Device 10 is positioned therebetween such that terminal leads 11 are constrained between facing surfaces of base member 13 and holding membe 14. A positionable shorting member, 15, of a conductive material, is engaged in base member 13 to thereby complete carrier 12.

Base member 13 is held against holding member 14, thereby constraining device 10, through the use of holding protuberances, 16, extending above that surface of base member 14 facing holding member 13 in FIG. 1. Each of holding protuberances 16 has a lip, 17, extending outward from that face of protuberance 16 facing across holding member 14 such that base member 13 can be held between lip 17 and the upward facing surface of holding member 14 as can be seen in FIGS. 2 and 3.

Figure 2:
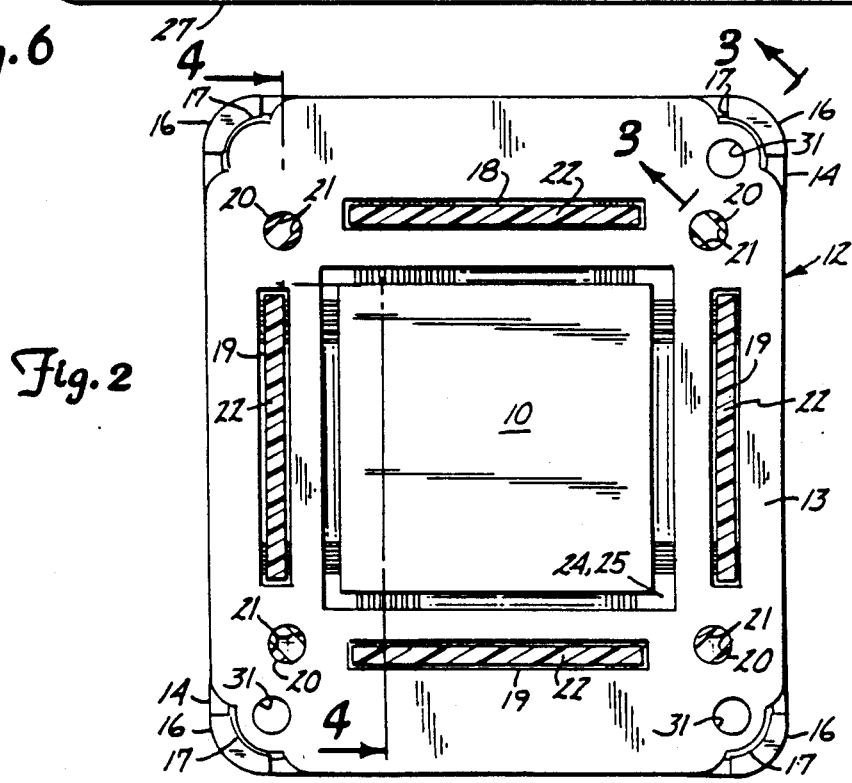
FIG. 2 is a cross section view of a portion of the present invention.

FIG. 2 is a cross section view of carrier 12 just below the upper portion of shorting member 15. FIGS. 3 and 4 are cross section views of portions of FIG. 2 as indicated by the cross section markings in FIG. 2. FIG. 2, on the other hand, in accord with the description thereof just given, is a cross section view of FIG. 4 but with all of the apparatus present of FIG. 2. Nevertheless, indications in the form of a pair of numerals 2 are provided in FIG. 4 to make clear where the section is taken in FIG. 4 to provide the view in FIG. 2. As can be seen in FIG. 2, for base member 13 being held by holding member 14, a peripheral portion of each of the rounded corners of base member 13 in place below lips 17 of each of the corresponding protuberances 16 where protuberances 16 are shown facing each other in pairs diagonally across holding member 14 and so across carrier 12.

FIG. 3 more clearly shows the relationship with the edge of a rounded corner of base member 13 in position below a lip 17 in the corresponding protuberance 16 shown. Thus, base member 13 is in substantial part between the underside of lip 17 and the surface of base holding member 14 against which base member 13 is positioned.

The result of base member 13 being held as shown by holding member 14 is that device 10 is constrained therebetween, but only so long as desired, as base member 13 can be separated from holding member 14. That is, a force can be applied to separate base member 13 and holding member 14 at some point that will be sufficient to cause base member 13 to slide by lip member 17 to thereby cause such a separation and free electrical device 10. This can be easily accomplished by inserting a flat instrument between base member 13 and holding member 14 followed by twisting this instrument sufficiently to force apart members 13 and 14.

Constraining electrical device 10 between base member 13 and holding member 14 must be done in a manner which protects coplanar leads 11 extending from device 10. Leads 11 are quite delicate and spaced quite closely together to permit the required electrical interconnection density necessary for very large scale monolithic integrated circuit chips which may require a hundred or more, perhaps even several hundred, electrical interconnections to be made thereto.

Leads 11 are protected in being constrained between base member 13 and holding member 14 in carrier 12 by placing each one between a pair of separating, channel lead protuberances, 18, projecting outward from the surface of base member 13 facing holding member 14. As indicated in FIG. 1, FIG. 5 is a cross section view of a portion of base member 13 showing channel lead protuberances extending below the main body portion of base member 13. Protuberances 18 can also be seen in FIG. 1, in part, extending below base member 13.

The spacing between each of the channel lead protuberances is just sufficient to contain a lead therein while the protuberances extend sufficiently far from the main body of base member 13 to prevent leads 11 from being damaged by holding member 14 being forced thereagainst. The additional depth of a portion of protuberances 18 on the right-hand side in FIG. 5 is such as to extend well below leads 11 but occurs for those portions of the proturberances 18 which do not have a holding member 14 surface thereagainst being instead within the interior central opening of holding member 14.

Also shown in FIG. 5 is a cross section of an insert opening, 19, having protrusions 18 on either side thereof. As can be seen in FIG. 1, base member 13 has four such insert openings 19. In addition, as can be seen in FIG. 1, there are four engagement openings, 20, provided in base member 13. Positionable shorting member 15 is engaged in base member 13 by having shorting member protrusions, 21, located on one side thereof, inserted in engagement openings 20. In this position, each shorting member portion, 22, of positionable shorting member 15 will be just over, or partly within, a corresponding insert opening 19.

Shorting member protrusions 21 have a longitudinal gap extending along the axis in the middle thereof and an outer lip around the remaining portions. Engagement openings 20 are each formed by having a slightly shorter diameter upper opening portion and a slightly larger diameter lower opening portion concentric about the axis of engagement opening 20 as it extends from one side of base member 13 to the other. This can be best seen in FIG. 4 where this cross section view shows opening 20 having an upper opening diameter just large enough to accommodate the diameter of shorting member protrusion 21 at its base with the lower opening portion having a bit larger diameter. Thus, protrusions 21 can be bent inward into the longitudinal gap to get through the smaller upper hole portion, but once through the lip on protrusions 21 prevents easy removal thereof from opening 20.

Holding member 14 also has engagement openings, 23, extending from one side thereof through to the other each of which openings corresponds to an engagement opening 20 in base member 13. As can be seen in FIG. 4, holding member engagement openings 23 are similarly constructed to base member openings 20 in having an upper opening portion of a smaller diameter than the lower opening portion to again permit capturing of the lip on a corresponding shorting member protrusion 21. This is the situation in FIG. 4 in which the shorting member protrusion 21 is shown extending through that corresponding base member engagement opening 20 and nearly through that corresponding holding member engagement opening 23 to have the lip thereof engaged against the shoulder in opening 23 formed by the smaller diameter upper portion of that opening.

Of course, shorting member portions 22 take positions with respect to base member 13 and holding member 14 in correspondence to the positions taken by shorting member protrusions 21 with respect to these same members. Thus, shorting member portions 22 extend through insert openings 19 and can extend just past the surface of base member 13 facing holding member 14. With shorting member protrusions 21 extending, as shown in FIG. 4, through base member engagement opening 20 and nearly through holding member engagement opening 23, shorting member portion 22 extends through insert opening 19 into contact with terminal leads 11 of electrical device 10. A portion of holding member 14 is directly across from each insert opening 19 to thereby provide support for terminal leads 11 where shorting portion 22 of positionable shorting member 15 presses thereagainst.

In this arrangement, device 10 is nestled in the chamber formed by base member central interior opening, 24, holding member central interior opening, 25, is protected from potentially damaging mechanical impacts by having base member 13 and holding member 14 arrayed therearound in constraining device 10. Leads 11 are protected from such impacts by lying between proturberances 18 while also being between base member 13 and holding member 14. In addition, positionable shorting member 15, in the position shown in FIG. 4, provides electrical protection to device 10 by shorting together all of terminal leads 11 since, as can be seen in FIG. 1, there will be a shorting member 22 available through each of insert openings 19 to contact all of leads 11 present.

Furthermore, positionable shorting member 15 can be forced out of holding member engagement opening 23 past the shoulder formed by the upper opening portion therein to thereby extend only through engagement opening 20 of base member 13. This removes each shorting member 22 from being in mechanical and electrical contact with leads 11. Thus, positionable shorting member 15 can, as desired, be in mechanical and electrical contact with terminal leads 11 or to not be in such contact to thereby permit electric signals to flow without interference in leads 11. If shorting member portions 22 are in contact with leads 11, thereby shorting them together, very good protection is provided against any static electricity accumulation discharging along one or more terminal leads 11 to possibly damage electrical device 10.

These results are achieved because positionable shorting member 15 is formed of a moldable plastic which is made conductive by the inclusion of a filler. On the other hand, base member 13 and holding member 14 are also each made of a moldable plastic but are not made so conductive that they would provide shorts between any of leads 11. Because the plastic materials must be moldable and because they must have a certain amount of elasticity to permit sliding one member past lips and shoulders of another member, the plastic material chosen will typically be a thermoplastic rather than a thermoset plastic. Furthermore, a thermoplastic construction for carrier 12 permits use of carrier 12 at relatively high temperatures to permit conducting tests of electrical device 10 in carrier 12 at such temperatures.

Suitable thermoplastics for use in constructing the members of carrier 12 for these purposes are polysulfone, polyethersulfone or polyetherimide. These thermoplastics can be provided with carbon fiber fillers in selected proportions to give the resistivity desired. Thus, for example, shorting member 15 can be formed of polysulfone having a carbon fiber filler in excess of 16% and, typically, at 21% to be a conductive material in providing a surface resistivity of $10^6$ $\Omega/\square$. Base member 13 and holding member 14 can also be formed of polysulfone, for this example, but without any carbon filler if a very high resistivity is desired for these members, i.e. dielectric material construction. However, as a further example, some additional electrostatic discharge protection can be provided by putting in 7% to 9% carbon fill in these members to bring the surface resistivity to $10^{12}$ $\Omega/\square$ as is typically done to provide material of a conductivity intermediate between conductors and dielectrics. The thermoplastic for these examples is usually obtained in the form of fine or granulated particles suitable for molding. Such materials can be obtained from Imperial Chemical Industries.

Positionable shorting member 15, of course, need not have a relatively low resistivity throughout, but only on that surface thereof which is in contact with terminal leads 11. Thus, forming such a contact surface by plating a carbon filled thermoplastic over an unfilled thermoplastic structural base would be sufficient. This would better permit the use of various colors in the remaining portions of positionable shorting member 15 if color coding for some purposes was desired because then the remaining portions can be much more easily colored if they are not carbon fiber filled.

Figure 6:
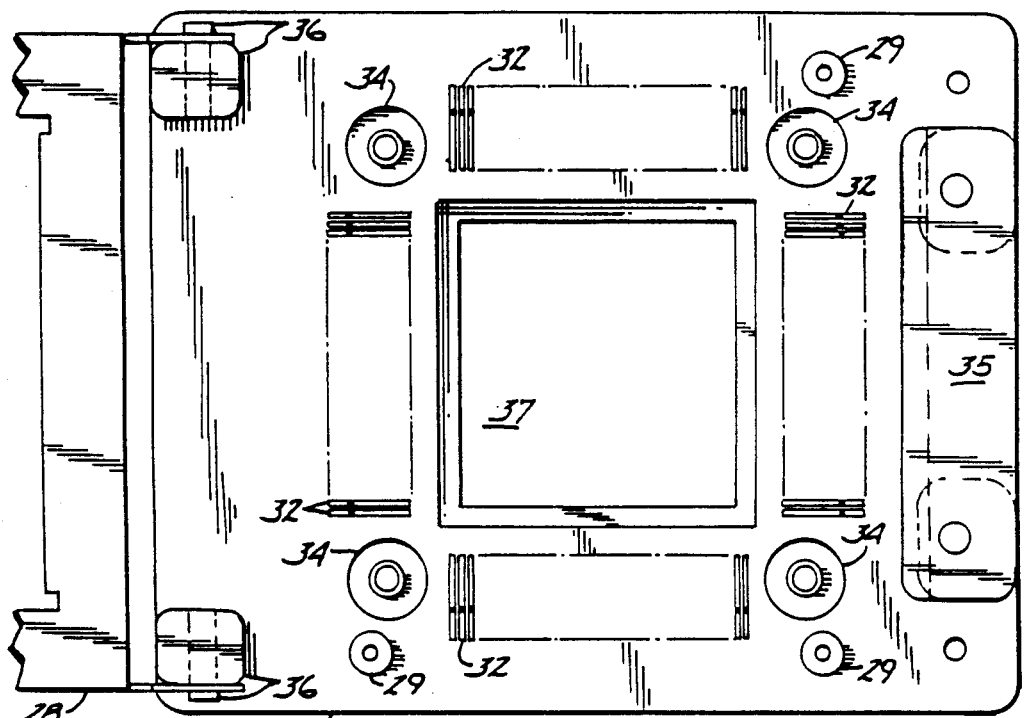
FIG. 6 is a plan view of a portion of the present invention.

Further shown in FIG. 1 is an electrical access socket, 26, which can be conveniently used with carrier 12 containing electrical device 10 to permit testing of device 10 in such circumstances. Socket 26 has a socket base member, 27, and a cover, 28, rotatably connected to base 27. Socket base 27 is shown in a plan view in FIG. 6.

Socket base 27 is shown having three reference protrusions, 29, projecting upward from the major surface thereof which faces carrier 12. Corresponding to reference protrusions 29 are reference openings, 30, in holding member 14 and reference openings, 31, in base member 13. Base member reference openings 31 are directly across from holding member reference openings 30 if held together by holding protrusions 16, but there is one less of base member reference openings 31 than there are of holding member reference openings 30. In such circumstances, carrier 12 can be placed on socket base 27 with reference protrusions 29 projecting through holding member reference openings 30 and base member reference openings 31 in just one position of carrier 12 with respect to base 27. As a result, carrier 12 is oriented and positioned with respect to socket base 27 in just one relationship. This is important because socket base 27 has a plurality of test pins, 32, which are intended to extend through access openings, 33, in holding member 14 to reach terminal leads 11. That is, access openings 33 extend from one side of holding member 14 through to the other with a portion of base member 13 across from each of access openings 33 to provide support for leads 11. This support permits pins 32 to contact leads 11 without bending such leads and assures good electrical contact therebetween. Carrier 12, being in a proper orientation because of the mating of reference protrusions 29 and the reference openings in holding member 14 and base member 13, assures that the proper test pins 32 are connected to the proper leads 11 so that desired test signals supplied to pins 32 reach the appropriate ones of leads 11.

Further shown on socket base 27 in FIG. 1 are four disengagement protrusions, 34, which are directly across from holding member engagement openings 23 if carrier 12 is properly positioned on socket base 27 with reference protrusions 29 inserted in holding member reference openings 30. In the typical situation of carrier 12 being used to fully protect device 10, positionable shorting member 15 will be positioned with respect to base member 13 and holding member 14 as shown in FIG. 4. That is, shorting member protrusions 21 will extend through base member engagement opening 20 and holding member engagement opening 23 to provide an electrical short across terminal leads 11 through shorting member portion 22 being in contact therewith. In this situation, leads 11 are protected from static discharge and device 10 can be handled easily and convenient without concern as to its vulnerability to damage from physical impact or static electricity discharge.

However, for testing, the short provided by shorting portion 22 must be removed from leads 11. This can be accomplished if disengagement protrusions 34, one being shown in part in FIG. 4 with a slope sided opening at its top, has carrier 12 forced downward thereover and over reference protrusions 29. This results in squeezing together somewhat the sides of and forcing, shorting member protrusion 21 out of holding member engagement openings 23.

The result of such a forcing of carrier 12 downward onto socket base 27 and thereafter closing coiver 28 over carrier 12 and latching it under a latch ledge, 35, is shown in FIG. 7, generally, and in more detail, because of break-aways in the view, in FIG. 8. In the broken away portion on the left-hand side of FIG. 8, a disengagement protrusion 34 can be seen after having been forced up into holding member engagement opening 23 to thereby force shorting member protuberance 21 to being just within base member engagement opening 20. As a result, as can be seen in the right-hand break-away portion in FIG. 8, shorting portion 22 of positionable shorting member 15 has been moved out of insert opening 19 and is no longer in contact with terminal leads 11. On the other hand, terminal leads 11 are now in electrical contact with test pins 32 through holding member access opening 33. As can be seen, test pins 32 extend out below socket base 27 of socket 26 to permit them to come into electrical contact with testing apparatus (not shown).

The rotating of cover 28 about pivot pin and standard arrangements, 36, and latching the lip of cover 28 under latch ledge 35 provides a distributed, firm pressure holding carrier 12 against base 27 to assure good contact between terminal leads 11 and test pins 32. Cover 28 is typically made of a metal providing good electrical conductivity and, if desired, can be arranged to be in contact with positionable shorting member 15 to provide a further path for discharging accumulated static electricity. This path could be completed by having a further connection made to cover 28 which could be, for instance, connected to a reference such as ground.

After testing is complete, the lip of cover 28 can be slid out from under latch ledge 35 and cover 28 rotated upward and away to permit removal of carrier 12 with electrical device 10 from socket 26 followed immediately by forcing positionable shorting member 15 downward with respect to base member 13 and holding member 14 to again establish contact between shorting portions 22 and leads 11. Thus, again, shorting member protuberances 21 would be forced into holding member engagement openings 23 and shorting portions 22 would follow into base member insert openings 19 and against terminal leads 11 to electrically short them together to reestablish static electricity discharge protection.

On completion of tests or any other activities in connection with electrical device 10, device 10 can be discarded if not to be further used, or can be taken as ready for insertion into that apparatus intended to make use of device 10. Thus, carrier 12, after being removed from socket 26, can be removed from about device 10 to permit such further action with respect to device 10. This is accomplished by forcing apart base member 13 and holding member 14 as desccribed above.

Socket base 27 of socket 26 is typically formed of a similar or the same material as are base member 13 and holding member 14. Thus, the entire assembly shown in FIGS. 6 and 7 can be placed in an elevated temperature chamber or other environmental setting to permit testing of electrical device 10 in that setting. Base 27 has a central opening, 37, therein to permit direct access to electrical device 10 on that side thereof facing socket 26.

Different geometries of the various openings, protrusions and outline shapes ffom those shown in the present figures could, of course, be used to accomplish what has been shown accomplished herein. Although the present invention has been described with reference to preferred embodiments, workers skilled in the art will recognize that changes may be made in form and detail without departing from the spirit and scope of the invention.

What is claimed is:

1. A protective apparatus for devices having electrically conductive, substantially coplanar terminal leads extending outward therefrom, said apparatus comprising:
   a base member of a first material and having first and second major surfaces on opposite sides thereof with there being a first insert opening extending between said base member first and second major surfaces;
   a holding member of a second material and having a first major surface such that said holding member can by selection be removably positioned against said base member to permit constraining therebetween those terminal leads of such a said device so that those terminal leads would, as a result, be between said base member first major surface and said holding member first major surface; and
   a positionable shorting member of an electrically conductive third material, said positionable shorting member being engaged with said base member such that a first shorting portion of said positionable shorting member can by selection be positioned to extend through said first insert opening from said base member second major surface past said base member first major surface but also, as an alternative, be positioned so that said first shorting portion is short of extending through said first insert opening past said base member first major surface.

2. The apparatus of claim 1 wherein said holding member has a second major surface on a side opposite that containing said first major surface and has a first access opening therein extending between said holding member first and second major surfaces.

3. The apparatus of claim 2 wherein a portion of said base member first major surface is directly across from said first access opening in said holding member first major surface if said holding member is removably positioned against said basic member as aforesaid.

4. The apparatus of claim 3 wherein said holding member, said base member and said positionable shorting member together form a carrier, and wherein said apparatus further comprises an electrical access socket having a first major surface against which said carrier can removably be positioned with said holding member second major surface being against electrical access socket first major surface, said electrical access socket having a plurality of electrically conductive test terminals which extend beyond said electrical access socket first major surface and at least some of which are positioned in said first access opening if said carrier is positioned against said electrical access socket as aforesaid.

5. The apparatus of claim 4 wherein said holding member has a plurality of access openings therein extending between said holding member first and second major surfaces, including said first access opening, with there being a portion of said base member first major surface directly across from each of said plurality of access openings in said holding member first major surface of said holding member is removably positioned against said base member as aforesaid, and wherein some of said conductive test terminals are positioned in each of said access openings if said carrier is positioned against said electrical access socket as aforesaid.

6. The apparatus of claim 5 wherein said holding member has a second major surface on a side opposite that side containing said holding member first major surface, and wherein said holding member has a plurality of reference openings therein with each said holding member reference opening extending between said holding member first and second major surfaces, and wherein said electrical access socket has a plurality of reference protrusions which extend beyond said electrical access socket first major surface such that said carrier, if positioned against said electrical access socket as aforesaid, has a reference protrusion corresponding to at least some of said holding member reference openings with such holding member reference openings being concentric thereabout and with each of said reference protrusions being positionable in a corresponding said holding member reference opening if said carrier is positioned against said electrical access socket as aforesaid.

7. The apparatus of claim 6 wherein said base member has a plurality of reference openings therein at said base member first major surface with each said base member reference opening being directly across from a corresponding said holding member reference opening if said holding member is removalby positioned against said base member as aforesaid.

8. The apparatus of claim 7 wherein said electrical access socket has a cover rotatably affixed thereto which can be rotated over said carrier if said carrier is removably positioned against said electrical access socket as aforesaid, said cover being releasably latched to said electrical access socket to hold said carrier against said electrical access socket.

9. The apparatus of claim 1 wherein said holding member has a plurality of holding protrusions extending past that side of said holding member on which said holding member first major surface occurs, each of said holding protuberances having a lip extending out from that surface portion thereof facing across said holding member first major surface such that said base member can selectively be on that side of each lip closet to said holding member first major surface to thereby hold said holding member removably positioned against said base member as aforesaid.

10. The apparatus of claim 9 wherein a pair of said holding protrusions directly face one another across said holding member first major surfce.

11. The apparatus of claim 9 wherein said holding member has a second major surface on a side opposite that side containing said holding member first major surface, and wherein said holding member has a plurality of reference openings therein with each said holding member reference opening extending between said holding member first and second major surfaces.

12. The apparatus of claim 11 wherein said base member has a plurality of reference openings therein at said base member first major surface with each said base member reference opening being directly across from a corresponding said holding member reference opening if said holding member is removably positioned against said base member as aforesaid.

13. The apparatus of claim 12 wherein there is one less in number of said base member reference openings than there is of said holding member reference openings.

14. The apparatus of claim 12 wherein each of said base member reference openings extends through said base member between said base member first and second major surfaces.

15. The apparatus of claim 1 wherein a portion of said holding member first major surface is directly across from said first insert opening in said base member first major surface if said holding member is removably positioned against said base member as aforesaid.

16. The apparatus of claim 1 wherein said first material is a dielectric material.

17. The apparatus of claim 16 wherein said first and second materials are substantially similar materials.

18. The apparatus of claim 1 wherein said first material has conductivity intermediate that between that of a dielectric and an electrical conductor.

19. The apparatus of claim 18 wherein said first and second materials are substantially similar materials.

20. The apparatus of claim 1 wherein there is provided a chamber portion opening from a selected one of said base member first major surface and said holding member first major surface in which a said electrical device to be protected could be positioned such that said terminal leads extending outward therefrom as aforesaid, would be positioned between said base member first major surface and said holding member first major surface as aforesaid.

21. The apparatus of claim 20 wherein said chamber portion opens from each of said base member first major surface and said holding member first major surface.

22. The apparatus of claim 21 wherein said chamber portion is provided by a chamber opening extending through said base member between said base member first and second major surfaces and by a chamber opening through said holding member between said holding member first and second major surfaces.

23. The apparatus of claim 1 wherein there is provided a plurality of insert openings in said base member extending between said base member first and second major surfaces including said first insert opening, and wherein said positionable shorting member has a plurality of shorting portions therein, including said first shorting portion, each of which can be selection be positioned to extend through a corresponding one of said plurality of insert openings from said base member second major surface past said base member first major surface but also, as an alternative, be positioned so that each said shorting portion is short of extending through its corresponding insert opening past said base member first major surface.

24. The apparatus of claim 23 wherein there is a portion of said holding member first major surface directly across from each of said insert openings in said base member first major surface if said holding member is removably positioned against said base member as aforesaid.

25. The apparatus of claim 24 wherein said base member has a plurality of engagement openings, said base member engagement openings each extending between said base member first and second major surfaces, and wherein said positionable shorting member has a plurality of shorting member protrusions on a common side thereof, each of said shorting member protrusions being inserted into a said base member engagement opening.

26. The apparatus of claim 25 wherein each of said plurality of shorting member protrusions has a lip thereon restricting removal thereof from said corresponding base member engagement opening.

27. The apparatus of claim 25 wherein said holding member also has a plurality of engagement openings which open in said holding member first major surface such that said holding member, if positioned against said base member as aforesaid, has a holding member engagement opening corresponding to each of said base member engagement openings with said holding member engagement openings each being directly across from said corresponding base member engagement opening if such holding member is removably positioned against said base member, as aforesaid, so that said shorting member protrusions are insertable into said holding member engagement openings also.

28. The apparatus of claim 27 wherein said holding member engagement openings extend through said holding member between said holding member first and second major surfaces.

29. The apparatus of claim 28 wherein each of said plurality of shorting member protrusions has a lip thereon restricting removal thereof from said corresponding base member engagement opening, and said lip on each of said plurality of shorting member protrusions also restricts removal thereof from said corresponding holding member engagement opening.

30. The apparatus of claim 1 wherein there is a plurality of terminal lead channels provided by a series of spaced apart channel lead protuberances projecting outward from said base member first major surface on opposite sides of said first insert opening in said base member first major surface.

31. The apparatus of claim 30 wherein there is provided a plurality of insert openings in said base member extending between said base member first and second major surfaces including said first insert opening, and wherein some of said plurality of terminal lead channels are provided on opposite sides of each of said insert openings in said base member first major surface.

32. The apparatus of claim 1 wherein said base member has a plurality of engagement openings, said base member engagement openings each extending between said base member first and second major surfaces, and wherein said positionable shorting member has a plurality of shorting member protrusions on a common side thereof, each of said shorting member protrusions being inserted into a said base member engagement opening.

33. The apparatus of claim 32 wherein each of said plurality of shorting member protrusions has a lip thereon restricting removal thereof from said corresponding base member engagement opening.

34. The apparatus of claim 32 wherein said holding member also has a plurality of engagement openings which open in said holding member first major surface such that said holding member, if positioned against said base member as aforesaid, has a holding member engagement opening corresponding to each of said base member engagement openings with said holding member engagement openings each being directly across from said corresponding base member engagement opening if such holding member is removably positioned against said base member, as aforesaid, so that said shorting member protrusions are insertable into said holding member engagement openings also.

35. The apparatus of claim 34 wherein said holding member engagement openings extend through said holding member between said holding member first and second major surfaces.

36. The apparatus of claim 35 wherein each of said plurality of shorting member protrusions has a lip thereon restricting removal thereof from said corresponding base member engagement opening, and said lip on each of said plurality of shorting member protrusions also restricts removal thereof from said corresponding holding member engagement opening.

37. The apparatus of claim 36 wherein said holding member has a second major surface on a side opposite to that containing said holding member first major surface and has a first access opening therein extending between said holding member first and second major surfaces, and wherein a portion of said base member first major surface is directly across from said first access opening in said holding member first major surface if said holding member is removably positioned against said base member as aforesaid, and wherein said holding member, said base member and said positionable shorting member together form a carrier, and wherein said apparatus further comprises an electrical access socket having a first major surface against which said carrier can removably be positioned with said holding member second major surface being against said electrical access socket first major surface, said electrical access socket having electrically conductive test terminals which extend beyond said electrical access socket first major surface and at least some of which can be positioned in said first access opening if said carrier is removably positioned against said electrical access socket as aforesaid, said electrical access socket having a plurality of disengagement protrusions which extend beyond said electrical access socket first major surface such that said electrical access socket, said carrier is removably positioned thereagainst as aforesaid, has a disengagement protrusion corresponding to each of said base and holding member engagement openings with said holding and base member engagement openings being concentric thereabout and with said disengagement protrusions being positioned in said holding member engagement openings if said carrier is removably positioned against said electrical access socket as aforesaid.

38. The apparatus of claim 37 wherein said holding member has a second major surface on a side opposite that side containing said holding member first major surface, and wherein said holding member has a plurality of reference opening therein with each said holding member reference opening extending between said holding member first and second major surfaces, and wherein said base member has a plurality of reference openings therein at said base member first major surface with each said base member reference openings, each being directly across from a corresponding said holding member reference opening if said holding member is removably positioned against said base member as aforesaid, and wherein said electrical access socket has a plurality of reference protrusions which extend beyond said electrical access socket first major surface such that said carrier, if removably positoned against said electrical access socket as aforesaid, has corresponding to at least some of said holding member reference openings, one of said reference protrusions and with each of said reference protrusions being positioned in a corresponding said holding member reference opening if said carrier is positioned against said electrical access socket as aforesaid.

39. The apparatus of claim 38 wherein said electrical access socket has a cover rotatably affixed thereto which can be rotated over said carrier if said carrier is removably positioned against said electrical access socket as aforesaid, said cover being releasably latched to said electrical access socket to hold said carrier against said electrical access socket.

40. A method of protecting devices having electrically conductive, substantially coplanar leads extending outward therefrom, said method comprising:

constraining said terminal leads of a said device between a base member and a holding member, said base member being of a first material and having first and second major surfaces on opposite sides thereof with there being a first insert opening extending between said base member first and second major surfaces, said holding member being of a second material and having a first major surface such that said holding member can by selection be removably positioned and held against said base member such that those said terminal leads are between said base member first major surface and said holding member first major surface; and positioning a positionable shorting member of an electrically conductive third material engaged with said base member such that a first shorting portion of said positionable shorting member extends through said first insert opening from said base member second major surface past said base member first major surface to contact said terminal leads.

41. The method of claim 40 wherein said holding member has an access opening therein opening into a second major surface of said holding member on a side thereof opposite that containing said holding member first major surface and further has a plurality of reference openings therein, said holding member and said base member each having a plurality of engagement openings therein corresponding to one another and with corresponding ones of a plurality of shorting member protrusions on one side of said positionable shorting member being inserted in both said base member and said holding member engagement openings, said base member and said holding member and said positionable shorting member together forming a carrier, and wherein there is further provided an electrical access socket having a first major surface against which said carrier can removably be positioned with said holding member second major surface being positioned against said electrical access socket first major surface, said electrically conductive test terminals which extend beyond said electrical access socket first major surface, said electrical access socket having a plurality of disengagement protrusions which extend beyond said electrical access socket first major surface, and said electrical access socket having a plurality of reference protrusions which extend beyond said electrical access socket first major surface, and said electrical access socket having a cover rotatably affixed thereto which can be releasably latched to said electrical access socket, and wherein said method further comprises placing said carrier against said electrical access socket with said holding member second major surface facing said electrical access socket first major surface, with said reference protrusions positioned in said holding member reference openings, with said test terminals across from said access opening, and with said disengagement protrusions directly across from said holding member engagement openings, and rotating said cover over said carrier and latching it such that said test pins are in said access opening and said disengagement protrusions are in corresponding said holding member engagement openings.

42. The method of claim 41 wherein said first material has a conductivity intermediate that between that of a dielectric and an electrical conductor.

43. The method of claim 41 wherein said first material is a dielectric material

44. The method of claim 43 wherein said first and second materials are substantially similar materials.

45. The method of claim 41 wherein said first material has a conductivity intermediate that between that of a dielectric and an electrical conductor.

46. The method of claim 45 wherein said first and second materials are substantially similar materials.

47. The method of claim 40 wherein said first material is a dielectric material

* * * * *

UNITED STATES PATENT AND TRADEMARK OFFICE
CERTIFICATE OF CORRECTION

PATENT NO. : 4,706,161
DATED : November 10, 1987
INVENTOR(S) : John S. Buckingham, Roanoke, Tex.

It is certified that error appears in the above-identified patent and that said Letters Patent is hereby corrected as shown below:

Col. 2, line 47, "membe" should read --member--.

Col. 3, line 56, "proturberances" should read --protuberances--.

Col. 4, line 61, "proturberances" should read --protuberances--.

Col. 5, line 15, after "more" add the word --of--.

Col. 6, line 52, "convenient" should read --conveniently--.

Col. 6, line 64, "coiver" should read --cover--.

Col. 7, line 61, "ffom" should read --from--.

Signed and Sealed this

Twentieth Day of June, 1989

Attest:

DONALD J. QUIGG

Attesting Officer

Commissioner of Patents and Trademarks